United States Patent [19]

Shigeno

[11] Patent Number: 5,227,646
[45] Date of Patent: Jul. 13, 1993

[54] OPTICAL SEMICONDUCTOR DEVICE WITH LAMINATED CERAMIC SUBSTRATE

[75] Inventor: Nobuo Shigeno, Kamakura, Japan

[73] Assignee: Kabushiki Kaisha Toshiba, Kawasaki, Japan

[21] Appl. No.: 820,124

[22] Filed: Jan. 14, 1992

[30] Foreign Application Priority Data

Jan. 14, 1991 [JP] Japan .................................. 3-002731

[51] Int. Cl.⁵ ............................................. H01L 33/00
[52] U.S. Cl. ......................................... 257/80; 257/81;
257/82; 257/98; 257/99; 257/703; 257/713;
372/36; 385/49; 361/388; 361/389
[58] Field of Search .................. 357/17, 74, 75, 81,
357/79, 81 A, 81 C, 74 C, 74 A, 74 B, 30 M, 30
FO, 19, 80, 72, 17 R, 17 L, 80, 72; 372/36, 35,
34; 385/49; 361/386, 388, 389; 257/80, 81, 82,
98, 99, 703, 713

[56] References Cited

U.S. PATENT DOCUMENTS

| 4,399,453 | 8/1983 | Berg et al. .................. 357/30 M X |
| 4,752,109 | 6/1988 | Gordon et al. ................ 357/74 X |
| 4,803,689 | 2/1989 | Shibanuma ................... 357/81 X |
| 5,068,865 | 11/1991 | Ohshima et al. .................. 372/36 |

FOREIGN PATENT DOCUMENTS

55-59786  5/1980  Japan .............................. 357/30 FO

*Primary Examiner*—William Mintel
*Attorney, Agent, or Firm*—Foley & Lardner

[57] ABSTRACT

In an optical semiconductor device having a light emitting element mounted on a heat sink, a first casing for supporting and covering the light emitting element and the heat sink, and a second casing for supporting and covering the first casing and further having output leads extended externally, a laminated ceramic substrate provided with a conductive pattern having one end connected to the light emitting element and the heat sink and the other end connected to the output leads is provided as a part of the first casing so as to partially replace a wall of the first casing with the laminated ceramic substrate. Since leads extending from the first outer casing and leads extending from the second outer casing are connected by a laminated ceramic substrate formed with a conductive pattern within the device, it is possible to freely determine the arrangement direction and the number of the leads while maintaining the hermetic characteristics of the heat sink, thus enabling the electric circuit elements to be integrated on the laminated ceramic substrate.

4 Claims, 2 Drawing Sheets

OPTICAL SEMICONDUCTOR DEVICE WITH LAMINATED CERAMIC SUBSTRATE

BACKGROUND OF THE INVENTION

The present invention relates to an optical semiconductor device used, for example, in optical fiber communications.

In the conventional optical semiconductor device, an optical semiconductor light emitting element and a light receiving element for monitoring the emitted light are mounted on a heat sink, and the respective elements are electrically connected to electrode leads supported by the heat sink and hermetically sealed using glass sealant.

In the conventional device as described above, an external package for covering the entire device is usually provided with parallel pins arranged in the vertical direction with respect to the light emitted by the optical semiconductor light emitting element, to facilitate mounting of the device on ordinary substrates, such as a printed wiring board. Therefore, electrode pins projecting from the heat sink are bent in the vertical direction within the external package and connected to external leads of the package.

Recently, high speed operation, miniaturization, and high integration of the electric circuit elements have been increasingly required in optical semiconductor devices used for optical communications. In order to realize the high speed operation, the length of the electrode lead connecting the heat sink and the package must be shortened, and further the inductance of the leads within the package must be reduced.

In a conventional optical semiconductor device, the leads of the heat sink are formed within the package in three dimensions. As a result it has been necessary to mount the device on a printed wiring board by bending the leads. This causes a problem in that the length of the leads becomes excessively large and thereby the inductance of the leads is increased, and higher speed operation of the optical semiconductor device is limited.

In addition, since the pins are bent and then mounted in a package, there exist other problems in that the workability is poor and further a space is inevitably required within the package, thus preventing the miniaturization of the package.

Furthermore, it has been difficult in practice to mount or integrate necessary electric circuit elements on a heat sink or to change the lead wiring arrangement, thereby restricting the freedom of circuit design.

SUMMARY OF THE INVENTION

Accordingly, the object of the present invention is to provide an optical semiconductor device in which the arrangement direction and the number of the leads within the inner heat sink may be freely determined and which has a high degree of assembling workability, increased operation speed, and is small in size.

According to the present invention, there is provided an optical semiconductor device comprising: a heat sink; a light emitting element mounted on a heat sink; a first casing for supporting and covering the light emitting element and the heat sink; a second casing for supporting and covering the first casing and further having output leads extended externally and a laminated ceramic substrate provided with a conductive pattern having a first end connected to the light emitting element and the heat sink and a second end connected to the output leads, the ceramic substrate being provided as a part of the first casing so as to partially replace a wall of the first casing therewith.

In the optical semiconductor device according to the present invention, since leads extending from the first casing and leads extending from the second casing are connected by a laminated ceramic substrate formed with a conductive pattern within the device, it is possible to freely determine the arrangement direction and the number of the leads while maintaining hermetic characteristics of the heat sink. Another advantage of the present invention is that electric circuit elements can be integrated on the laminated ceramic substrate.

In addition, since the laminated ceramic substrate is used, both the length and the inductance of the inner lead pins can be decreased, so that it is possible to increase the operation speed.

DETAILED DESCRIPTION OF THE PREFERRED EMBODIMENTS

Figure 1:
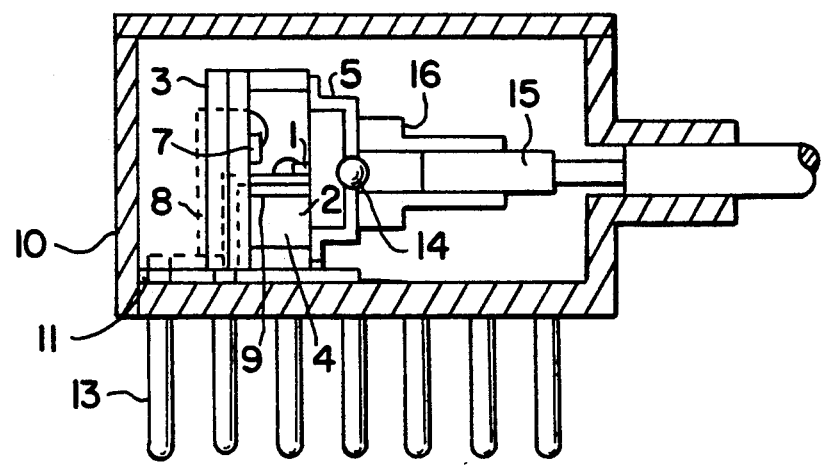
FIG. 1 is a cross-sectional view showing a first embodiment of the optical semiconductor device according to the present invention.

FIG. 1 is a cross-sectional view showing an example of the optical semiconductor device related to the present invention.

An optical semiconductor light emitting element 1 is mounted on a heat sink 2, and is electrically connected to pattern electrodes formed on a ceramic substrate 9 arranged on the heat sink 2 by wire bonding. Furthermore, the heat sink 2 and the pattern electrodes formed on the ceramic substrate 9 on the heat sink 2 are electrically connected to an electrode pattern 8 formed on a laminated ceramic substrate 3 arranged vertically on the side surface of the heat sink 2.

The heat sink 2 is fixed to a metallic frame 4 by metallization, so that heat generated from the light emitting element 1 is conducted to the metallic frame 4 via the heat sink 2 and then radiated externally.

The heat sink 2 is hermetically sealed by a cap 5 provided with a lens 14. The light emitted from the optical semiconductor element 1 is condensed by this lens 14 and then guided to the outside through an optical fiber 15 supported by an optical fiber holder 16.

Furthermore, the heat sink 2 and the parts of the optical system including the optical fiber 15 and the lens 14 are held by an external casing 10. The electrode leads of the heat sink 2 are fixed at predetermined positions in parallel to the light emitted from the optical semiconductor light emitting element 1 and in three-dimensional positional relationship with respect to the heat sink 2.

A light receiving element 7 for monitoring the light emitting element 1 is mounted on the laminated ceramic substrate 3 and electrically connected to the electrode pattern 8 by wire bonding. Furthermore, the electrode patterns formed on the laminated ceramic substrate 3 and the ceramic substrate 9 are usually formed by a thick film generally of a three-layer structure of gold and platinum.

The respective electrode patterns 8 are passed through the inside of the laminated ceramic substrate 3 and electrically connected to the electrode pattern formed on the ceramic substrate 9 disposed within the external package 10. In addition, wires on the ceramic substrate 9 are electrically connected to external leads 13 of the external package 10.

Figure 2:
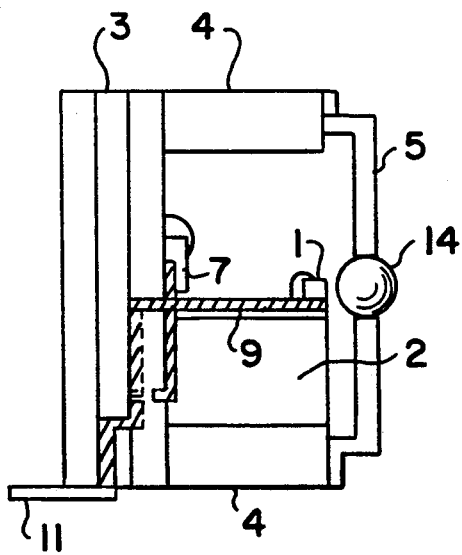
FIG. 2 is a cross-sectional view showing the vicinity of the heat sink of the first embodiment shown in FIG. 1.

FIG. 2 is a cross-sectional view showing a detailed structure of the vicinity of the heat sink of the embodiment shown in FIG. 1. In this embodiment, a part of the casing of the conventional device is replaced with the laminated ceramic substrate 3, and an electrode pattern 11 connected to the external leads 13 is formed on this laminated ceramic pattern 3. Furthermore, the electrode pattern is electrically connected to the light emitting element 1 or the light receiving element 7.

Figure 3:
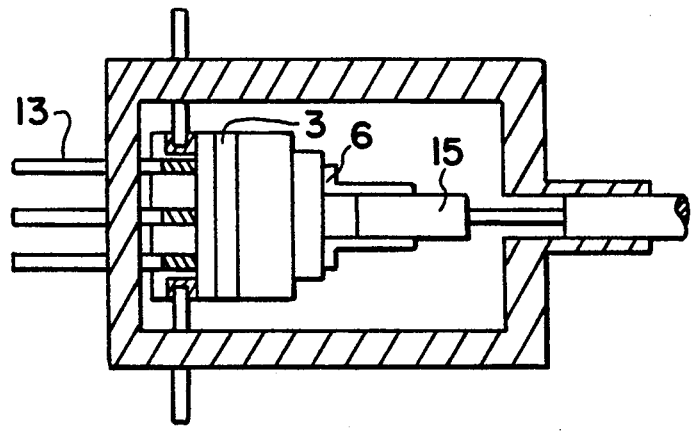
FIG. 3 is a detailed cross-sectional view showing another embodiment of the present invention when seen from above.
Figure 4:
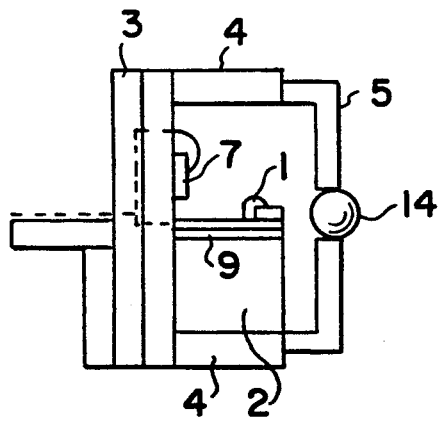
FIG. 4 is a detailed cross-sectional view showing the vicinity of the heat sink of the embodiment shown in FIG. 3.

FIGS. 3 and 4 show another embodiment of the present invention, in which FIG. 3 is a cross-sectional view when seen from above, and FIG. 4 is a detailed cross-sectional view showing the vicinity of the heat sink shown in FIG. 3.

In the embodiment shown in FIGS. 1 and 2, the external leads 13 are directed at right angles with respect to the travel direction of the emitted light or the longitudinal direction of the optical fiber 14. In the embodiment shown in FIGS. 3 and 4, however, the external leads 13 are directed in parallel to the travel direction of the emitted light or the longitudinal direction of the optical fiber 14.

In general, the pitch of the light emitting receiving elements do not match that of the mounted leads of the optical semiconductor device. However, when the structure as described above is adopted, it is possible to change the lead pitch by changing the conductive pattern formed on the ceramic substrate.

What is claimed is:

1. An optical semiconductor device comprising:
   a heat sink;
   a light emitting element mounted on said heat sink;
   a first casing for supporting and covering said light emitting element and said heat sink;
   a second casing for supporting and covering said first casing and further having output leads extending externally from said second casing; and
   a laminated ceramic substrate forming part of said first casing, wherein said laminated ceramic substrate includes a conductive pattern having a first end connected to said light emitting element and said heat sink and a second end connected to said output leads.

2. An optical semiconductor device as recited in claim 1, further comprising:
   a light receiving element which monitors light emitted from said light emitting element;
   a lens which condenses said light emitted from said light emitting element; and
   an optical fiber which guides said light condensed by said lens out of said second casing; wherein
   said light receiving element, said lens, and said optical fiber are supported by said first casing; and
   said optical fiber is also supported by said second casing.

3. An optical semiconductor device as recited in claim 1, wherein said conductive pattern in said laminated ceramic substrate is formed so as to allow said output leads to extend externally at an angle substantially perpendicular to an optical fiber, said optical fiber guiding light out of said second casing.

4. An optical semiconductor device as recited in claim 1, wherein said laminated ceramic substrate forming part of said first casing partially replaces a wall of said first casing.

* * * * *